(12) United States Patent
Kimishima et al.

(10) Patent No.: US 11,122,686 B2
(45) Date of Patent: Sep. 14, 2021

(54) WIRING SUBSTRATE

(71) Applicant: IBIDEN CO., LTD., Gifu (JP)

(72) Inventors: Yasuki Kimishima, Ogaki (JP); Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/132,376

(22) Filed: Dec. 23, 2020

(65) Prior Publication Data
US 2021/0259107 A1    Aug. 19, 2021

(30) Foreign Application Priority Data

Feb. 13, 2020 (JP) .............................. JP2020-022675

(51) Int. Cl.
| | |
|---|---|
| *H05K 1/11* | (2006.01) |
| *H05K 3/00* | (2006.01) |
| *H05K 1/03* | (2006.01) |
| *H05K 3/06* | (2006.01) |
| *H05K 3/42* | (2006.01) |

(52) U.S. Cl.
CPC ............ *H05K 1/116* (2013.01); *H05K 3/0038* (2013.01); *H05K 3/0055* (2013.01); *H05K 1/0366* (2013.01); *H05K 3/0094* (2013.01); *H05K 3/06* (2013.01); *H05K 3/428* (2013.01); *H05K 2201/029* (2013.01); *H05K 2201/0769* (2013.01); *H05K 2201/0959* (2013.01); *H05K 2201/09581* (2013.01); *H05K 2201/09609* (2013.01); *H05K 2201/09636* (2013.01); *H05K 2203/107* (2013.01)

(58) Field of Classification Search
CPC ............................................. H05K 1/113–119
See application file for complete search history.

(56) References Cited

FOREIGN PATENT DOCUMENTS

JP          2003-142826 A       5/2003

*Primary Examiner* — Jeremy C Norris
(74) *Attorney, Agent, or Firm* — Oblon, McClelland, Maier & Neustadt, L.L.P.

(57) ABSTRACT

A wiring substrate includes an insulating layer having through holes, a first conductor layer formed on first surface of the insulating layer, a second conductor layer formed on second surface of the insulting layer on the opposite side, and interlayer connection conductors formed in the through holes through the insulating layer and connecting the first and second conductor layers. The insulating layer is formed such that the though holes include first and second groups of through holes and that the through holes in the second group have inner walls covered with non-conductive resin, and the interlayer conductors includes first interlayer conductors each including a plating film formed in the first group of through holes, and second interlayer conductors each including a plating film formed in the second group of through holes such that minimum distance between the second interlayer conductors is smaller than minimum distance between the first interlayer conductors.

20 Claims, 8 Drawing Sheets

WIRING SUBSTRATE

CROSS-REFERENCE TO RELATED APPLICATIONS

The present application is based upon and claims the benefit of priority to Japanese Patent Application No. 2020-022675, filed Feb. 13, 2020, the entire contents of which are incorporated herein by reference.

BACKGROUND OF THE INVENTION

Field of the Invention

The present invention relates to a wiring substrate.

Description of Background Art

Japanese Patent Application Publication No. 2003-142826 describes a multilayer wiring substrate that includes an insulating layer and multiple through-hole conductors, the insulating layer containing a glass fiber, and the through-hole conductors being respectively formed on inner peripheral surfaces of through holes penetrating the insulating layer. The entire contents of this publication are incorporated herein by reference.

SUMMARY OF THE INVENTION

According to one aspect of the present invention, a wiring substrate includes an insulating layer having through holes, a first conductor layer formed on a first surface of the insulating layer, a second conductor layer formed on a second surface of the insulting layer on the opposite side with respect to the first surface of the insulating layer, and interlayer connection conductors formed in the through holes through the insulating layer and connecting the first conductor layer and the second conductor layer. The insulating layer is formed such that the though holes include a first group of through holes and a second group of through holes and that the through holes in the second group have inner walls covered with non-conductive resin, respectively, and the interlayer connection conductors includes first interlayer connection conductors each including a plating film formed in the first group of through holes, and second interlayer connection conductors each including a plating film formed in the second group of through holes such that a minimum distance between the second interlayer connection conductors is smaller than a minimum distance between the first interlayer connection conductors.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
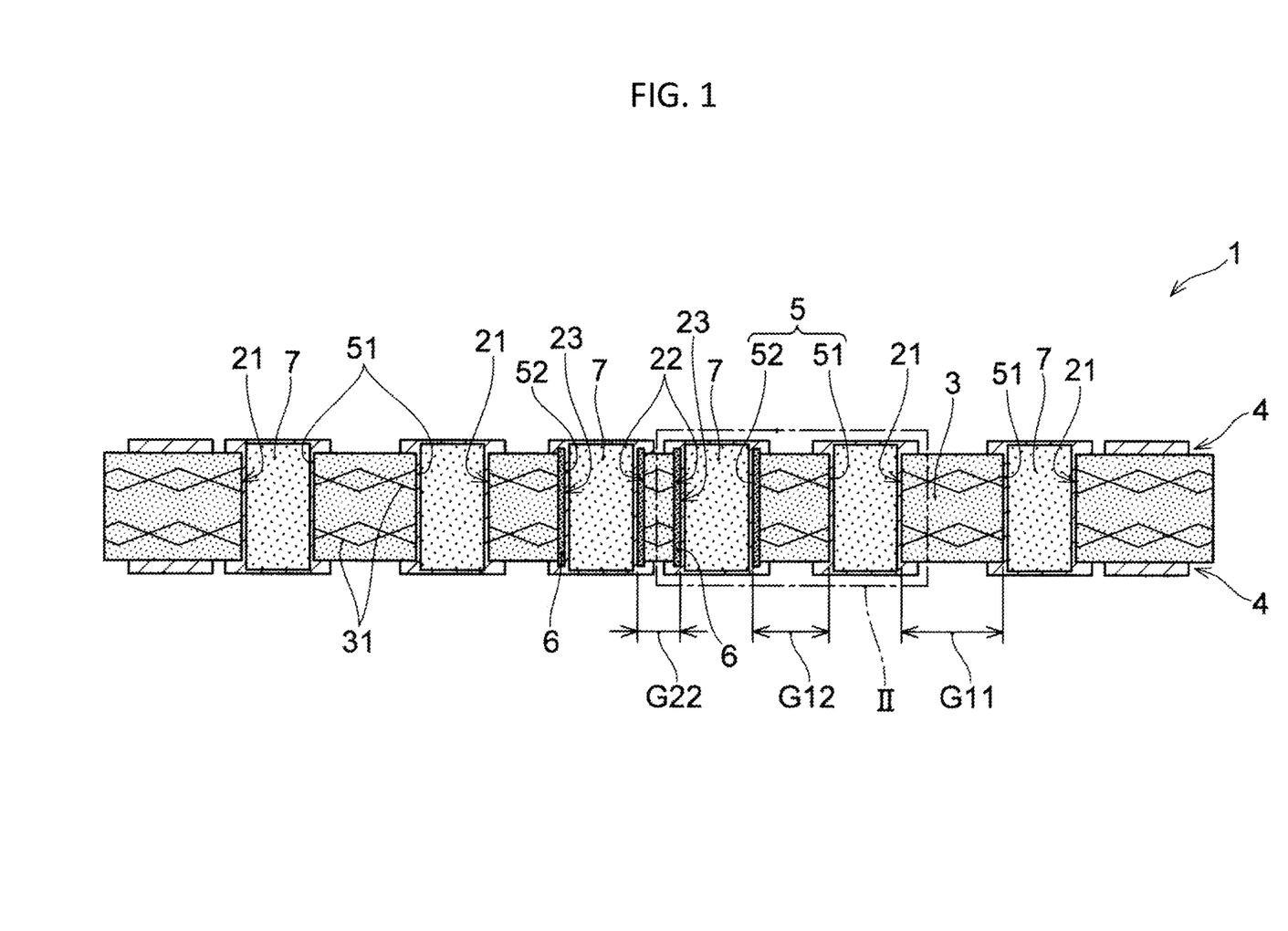
FIG. 1 is a cross-sectional view illustrating an example of a wiring substrate according to an embodiment of the present invention.
Figure 2:
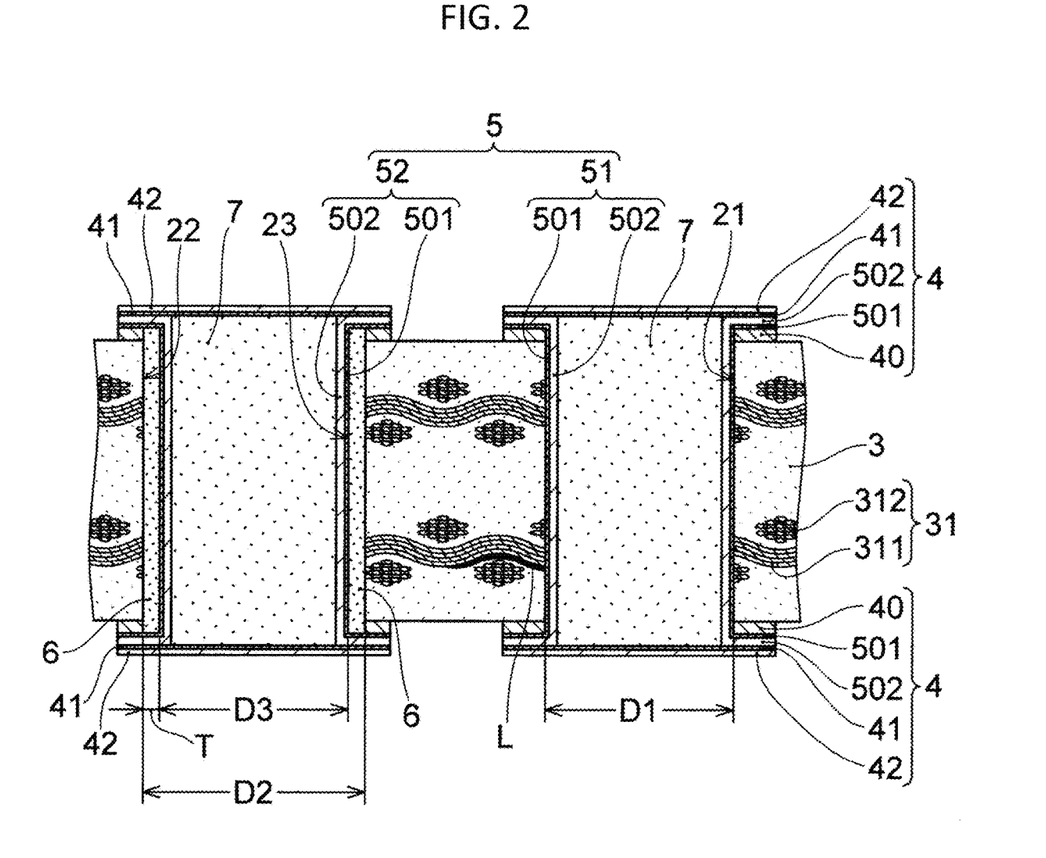
FIG. 2 is an enlarged view of a portion (II) of the wiring substrate of FIG. 1.
Figure 3:
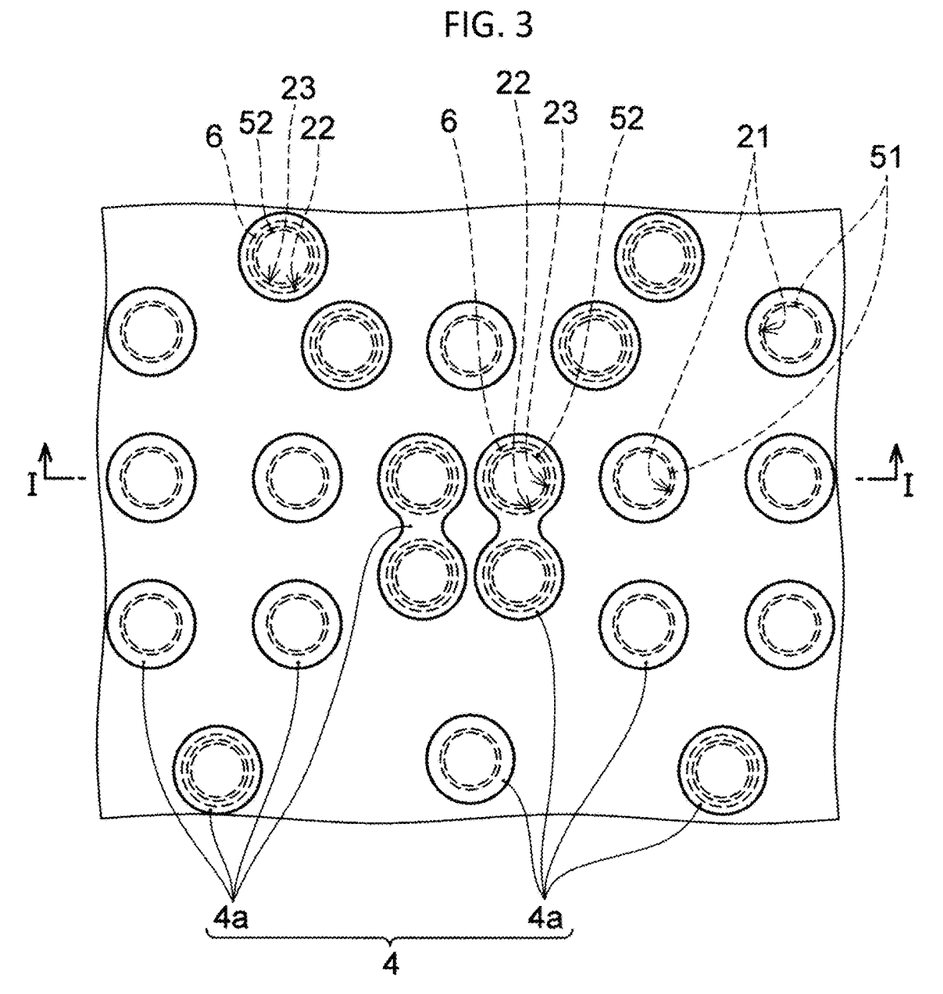
FIG. 3 is a plan view illustrating an example of the wiring substrate according to the embodiment of the present invention.

A wiring substrate of an embodiment of the present invention is described with reference to the drawings. FIG. 1 is a cross-sectional view illustrating a wiring substrate 1 which is an example of the wiring substrate of the embodiment. FIG. 2 illustrates an enlarged view of a portion (II) of FIG. 1. FIG. 3 illustrates a plan view of a portion of the wiring substrate 1. The cross-sectional view of FIG. 1 illustrates an example of a cross section along an I-I line of FIG. 3.

As illustrated in FIGS. 1-3, the wiring substrate 1 of the present embodiment includes an insulating layer 3 having multiple through holes (first through holes 21 and second through holes 22), two conductor layers 4 opposing each other via the insulating layer 3, and multiple interlayer connection conductors 5 connecting the two conductor layers 4 to each other. The multiple interlayer connection conductors 5 include first interlayer connection conductors 51 and second interlayer connection conductors 52. In the wiring substrate 1 of the example of FIG. 1, the multiple interlayer connection conductors 5 are each a through-hole conductor connecting to each other the conductor layers 4 sandwiching the insulating layer 3. The wiring substrate 1 of the present embodiment further includes non-conductive resins 6 that respectively cover inner walls of the second through holes 22, which are some of the multiple through holes. The first interlayer connection conductors 51 are respectively formed by plating films in the first through holes 21, which are through holes other than the second through holes 22 among the multiple through holes. The first through holes 21 respectively contain the first interlayer connection conductors 51. The multiple interlayer conductors 5 include at least two first interlayer connection conductors 51 and at least two second interlayer connection conductors 52.

The second interlayer connection conductors 52 are respectively formed by plating films in the second through holes 22. The second through holes 22 respectively contain the second interlayer connection conductors 52. The second interlayer connection conductors 52 are respectively formed on inner peripheral sides of the non-conductive resins 6 in the second through holes 22. Therefore, the non-conductive resins 6 are respectively interposed between the second interlayer connection conductors 52 and the inner walls of the second through holes 22. In other words, the wiring substrate 1 includes third through holes 23 penetrating the insulating layer 3 and the non-conductive resins 6, and inner walls of the third through holes 23 are respectively covered by the second interlayer connection conductors 52. The third through holes 23 respectively contain the second interlayer connection conductors 52, and the second through holes 22 respectively contain the third through holes 23.

That is, inside the second through holes 22, insulating films are respectively formed by the non-conductive resins 6 on the outermost peripheral sides, and the second interlayer connection conductors 52 are respectively formed on inner wall surfaces of the third through holes 23 that respectively penetrate the non-conductive resins 6. With such a structure, contact between the second interlayer connection conductors 52 and surrounding conductors via the insulating layer 3 is prevented by the non-conductive resins 6. For example, it is thought that penetration of a plating solution from the second through holes 22 into the insulating layer 3 during the formation of the interlayer connection conductors is prevented. Further, it is thought that a short circuit between each second interlayer connection conductor 52 and its surrounding interlayer connection conductors due to migration or the like of a conductive substance in the insulating layer 3 when the wiring substrate 1 is used is prevented. In the wiring substrate 1, each second interlayer connection conductor 52 can be formed close to its surrounding interlayer connection conductors (first interlayer connection conductors 51 and second interlayer connection conductors 52).

FIG. 1 illustrates a minimum distance (G11) between the first interlayer connection conductors 51, a minimum distance (G12) between the first interlayer connection conductors 51 and the second interlayer connection conductors 52, and a minimum distance (G22) between the second interlayer connection conductors 52 in the wiring substrate 1. As illustrated in FIG. 1, in the wiring substrate 1, the minimum distance (G22) between the second interlayer connection conductors 52 is smaller than the minimum distance (G11) between the first interlayer connection conductors 51. Therefore, by appropriately using the second interlayer connection conductors 52, the multiple interlayer connection conductors 5 connecting to each other the two conductor layers 4 can be formed close to each other and/or densely. For example, by forming the second interlayer connection conductors 52 as close to each other as possible within a range of a manufacturing restriction or the like, it is possible to contribute to the miniaturization of the wiring substrate 1.

Further, even when a second interlayer connection conductor 52 and a first interlayer connection conductor 51 are adjacent to each other, at least, formation of a conductor due to migration or the like occurring from the second interlayer connection conductor 52 is prevented by the non-conductive resin 6. Therefore, the minimum distance (G12) between the first interlayer connection conductors 51 and the second interlayer connection conductors 52 may be the same as the minimum distance (G22) between the second interlayer connection conductors 52. However, since migration or the like may occur from the first interlayer connection conductors 51, as illustrated in FIG. 1, the minimum distance (G12) between the first interlayer connection conductors 51 and the second interlayer connection conductors 52 is preferably larger than the minimum distance (G22) between the second interlayer connection conductors 52. That is, the minimum distance (G22) between the second interlayer connection conductors 52 may be the same as the minimum distance (G12) between the first interlayer connection conductors 51 and the second interlayer connection conductors 52, or may be smaller than the minimum distance (G12).

Further, since at least occurrence of migration or the like from the second interlayer connection conductors 52 is prevented, the minimum distance (G12) between the first interlayer connection conductors 51 and the second interlayer connection conductors 52 may be smaller than minimum distance (G11) between the first interlayer connection conductors 51.

In the present embodiment, regarding positions of two closest through-hole conductors (first and/or second interlayer connection conductors (51, 52)), there is no restriction with respect to an extending direction of a glass fiber contained in an insulating layer as in Japanese Patent Application Publication No. 2003-142826 described above. That is, since a short circuit between a second interlayer connection conductor 52 and its surrounding interlayer connection conductors is prevented by the non-conductive resin 6 covering the second interlayer connection conductor 52, a short circuit between the interlayer connection conductors is prevented independently of a positional relationship between the interlayer connection conductors. For example, even when the insulating layer 3 contains a fibrous reinforcing material 31 as in the example of FIG. 1, closest multiple interlayer connection conductors 5 can be formed along an extension direction of the fiber. It is thought that the design flexibility regarding the positions of the multiple interlayer connection conductors 5 is high. Therefore, according to the present embodiment, it is thought that miniaturization and desired electrical characteristics of a wiring substrate having high reliability in insulation can be easily achieved.

The insulating layer 3 is formed of any insulating resin. Examples of the insulating resin include an epoxy resin, a bismaleimide triazine resin (BT resin), a phenol resin, and the like. The insulating layer 3 formed using these insulating resins may contain an inorganic filler such as silica. As described above, in the example of FIG. 1, the insulating layer 3 contains the reinforcing material 31. The reinforcing material 31 is formed of a fiber. Examples of the fiber forming the reinforcing material 31 include a glass fiber, an aramid fiber, and the like. However, a material of the fiber forming the reinforcing material 31 is not limited to these.

Further, in FIG. 1, the reinforcing material 31 is schematically illustrated. However, as specifically illustrated in FIG. 2, the fiber forming the reinforcing material 31 includes warp threads 311 and weft threads 312. The first through holes 21 and the second through holes 22 cut through the fiber (the warp threads 311 and the weft threads 312) forming the reinforcing material 31. In FIG. 2, the reinforcing material 31 has a form of a woven fabric woven with the warp threads 311 and the weft threads 312. However, the reinforcing material 31 formed of a fiber may be a non-woven fabric formed in a cloth-like form without weaving the fiber.

The first interlayer connection conductors 51 and the second interlayer connection conductors 52 each include a metal film 501 and a plating film 502 formed on the metal film 501. The metal film 501 functions as a power feeding layer and/or a seed layer when the plating film 502 is formed by electrolytic plating. The metal film 501 is formed by, for example, electroless plating or sputtering. An example of a method for forming the plating film 502 is electrolytic plating. However, the interlayer connection conductors (51, 52) may each include only a metal film 501 or a plating film 502 formed by electroless plating. Examples of a material forming the interlayer connection conductors (51, 52) include mainly copper, nickel, and the like. However, the material of the interlayer connection conductors (51, 52) is not limited to these.

In a plating process when the interlayer connection conductors (51, 52) are formed, interiors of the first through holes 21 and the second through holes 22 for forming the interlayer connection conductors (51, 52) are exposed to a plating solution, and a metal such as copper is deposited on inner wall surfaces thereof. In this case, the plating solution may permeate into the insulating layer 3 from the inner wall surfaces of the through holes (21, 22). In particular, as illustrated in FIG. 2, when the insulating layer 3 contains the reinforcing material 31 containing a fiber, a plating solution (L) can easily permeate into the insulating layer 3 along an interface between the fiber and the resin. As in the example of FIG. 2, when end faces of the fiber (the warp threads 311 or the weft threads 312) (cut surfaces due to the through holes (21, 22)) are exposed on the inner wall surfaces of the through holes (21, 22), the plating solution (L) is more likely to permeate into the insulating layer 3. When the plating solution (L) permeates into the insulating layer 3 along the fiber of the reinforcing material 31, a metal is also deposited in the insulating layer 3 along the fiber of the reinforcing material 31. Such deposition of a metal may cause a short circuit between adjacent through-hole conductors in the multilayer wiring substrate described in Japanese Patent Application Publication No. 2003-142826 described above. Further, when the multilayer wiring substrate of Japanese Patent Application Publication No. 2003-142826 is used, migration progressing from a metal forming a through-hole conductor toward adjacent through-hole conductors may occur over time. Also in this case, a short circuit may occur between adjacent through-hole conductors.

However, in the present embodiment, the non-conductive resins 6 are respectively interposed between the second interlayer connection conductors 52 and the inner walls of the second through holes 22. Therefore, permeation of the plating solution from the second through holes 22 into the insulating layer 3 and progression of migration from the metals (the metal film 501 and the plating film 502) forming the second interlayer connection conductors 52 are prevented.

Further, even when the plating solution permeates into the insulating layer 3 from the first through holes 21 and a plating metal is deposited in the insulating layer 3, contact between the plated metal and the second interlayer connection conductors 52 is prevented by the non-conductive resins 6. Similarly, even in an unlikely event that migration progresses from the first interlayer connection conductors 51 to the second interlayer connection conductors 52, contact between a metal transferred by the migration and the second interlayer connection conductors 52 is prevented by the non-conductive resins 6.

That is, even when a second interlayer connection conductor 52 and a first interlayer connection conductor 51 are formed so close to each other that the plating solution that has permeated into the insulating layer 3 from the first through holes 21 can reach the second interlayer connection conductor 52, a short circuit is unlikely to occur between these two interlayer connection conductors. Further, even when a second interlayer connection conductor 52 and a first interlayer connection conductor 51 are formed so close to each other that a metal transferred by migration from the first interlayer connection conductors 51 can reach the second interlayer connection conductor 52, a short circuit is unlikely to occur between these two interlayer connection conductors. Of course, a short circuit due to permeation of the plating solution, or migration, into the insulating layer 3 is unlikely to occur between the second interlayer connection conductors 52. For the second interlayer connection conductors 52, even in an unlikely event that a crack or a pinhole exists in the non-conductive resin 6 surrounding one of the second interlayer connection conductors 52, a short circuit between the second interlayer connection conductors 52 is prevented by the non-conductive resins 6 surrounding the other second interlayer connection conductors 52.

In the wiring substrate 1, from a point of view of preventing a short circuit between adjacent interlayer connection conductors, it may be preferable that all the multiple interlayer connection conductors 5 be the second interlayer connection conductors 52. However, when the individual non-conductive resins 6 are properly provided, a short circuit between one second interlayer connection conductor 52 and its surrounding interlayer connection conductors (51, 52) can be substantially prevented. On the other hand, properly covering the inner wall surfaces of all the second through holes 22 with the non-conductive resins 6 may increase a material cost and/or a manufacturing cost of the wiring substrate 1 depending on the number of the second through holes 22. Therefore, in the wiring substrate 1 of the present embodiment, the first interlayer connection conductors 51 and the second interlayer connection conductors 52 coexist.

Further, in the present embodiment, the minimum distance (G22) between the second interlayer connection conductors 51 surrounded by the non-conductive resins 6 is smaller (narrower) than the minimum distance (G11) between the first interlayer connection conductors 51. Further, the minimum distance (G22) between the second interlayer connection conductors 52 may be the same as or smaller (narrower) than the minimum distance (G12) between the first interlayer connection conductors 51 and the second interlayer connection conductors 52. Further, the minimum distance (G12) between the first interlayer connection conductors 51 and the second interlayer connection conductors 52 may be smaller (narrower) than the minimum distance (G11) between the first interlayer connection conductors 51.

For example, in the positions of the multiple interlayer connection conductors 5, for two interlayer connection conductors 5 that are required to be formed at a certain distance or less in order to achieve a desired electrical characteristic or to achieve a reduction in size, or the like, at least one of them is formed to be a second interlayer connection conductor 52, and preferably both of them are formed to be second interlayer connection conductors 52. Further, for example, for two interlayer connection conductors 5 that are not required to be formed at a certain distance or less, both of them are formed to be first interlayer connection conductors 51. In this way, according to the wiring substrate 1 of the present embodiment, by appropriately positioning the first interlayer connection conductors 51 and the second interlayer connection conductors 52, it may be possible to achieve miniaturization and desired electrical characteristics of the wiring substrate 1 while preventing a short circuit between the multiple interlayer connection conductors 5.

The minimum distance (G22) between the second interlayer connection conductors 52 is, for example, 150 μm or more and 300 μm or less. The minimum distance (G12) between the first interlayer connection conductors 51 and the second interlayer connection conductors 52 is, for example, 250 μm or more and 400 μm or less. Further, the minimum distance (G11) between the first interlayer connection conductors 51 is, for example, larger than 400 In this way, by forming the first and second interlayer connection conductors (51, 52) so as to have such minimum distances, it may be possible to achieve miniaturization and desired electrical characteristics of the wiring substrate 1 while preventing a short circuit between the multiple interlayer connection conductors 5.

The minimum distance (G12) between the second interlayer connection conductors 52 and the first interlayer connection conductors 51 is a minimum distance between the inner walls of the third through holes 23 and the inner walls of the first through holes 21. The minimum distance (G22) between the second interlayer connection conductors 52 is a minimum distance between the inner walls of the third through holes 23. The minimum distance (G11) between the first interlayer connection conductors 51 is a minimum distance between the inner walls of the first through holes 21.

In the example of FIG. 2, an inner diameter (D3) of each of the third through holes 23 and an inner diameter (D1) of each of the first through holes 21 are substantially equal to each other. When the first through holes 21 and the third through holes 23 are formed by laser processing or drilling, the first and third through holes (21, 23) can be efficiently formed without changing a spot diameter of a laser beam or a drill diameter according to a type of a through hole. The inner diameter (D1) of each of the first through holes 21 and the inner diameter (D3) of each of the third through holes 23 are, for example, 60 μm or more and 300 μm or less.

On the other hand, an inner diameter (D2) of each of the second through holes 22 is larger than the inner diameter (D3) of each of the third through holes 23 and the inner diameter (D1) of each of the first through holes 21. Therefore, an insulating film formed of a non-conductive resin 6 can be formed between a second interlayer connection conductor 52 and an inner wall of a second through hole 22.

The term "inner diameter" is used for convenience. However, a planar shape (a cross-sectional shape in a plane perpendicular to a thickness direction of the insulating layer 3) of each of the first—third through holes (21-23) and the first and second interlayer connection conductors (51, 52) contained therein is not limited to a circle. The "inner diameter" of each of the first—third through holes (21-23) is a maximum distance between two points on an outer periphery of a planar shape of the each of the through holes.

The non-conductive resins 6 are any insulating resins. For example, the non-conductive resins 6 are epoxy resins, acrylic resins, phenol resins, or the like. The non-conductive resins 6 may contain inorganic particles such as magnetic particles. However, the non-conductive resins 6 are not limited to these resins as long as the non-conductive resins 6 have an insulating property and can suppress a short circuit between each second interlayer connection conductor 52 and its surrounding interlayer connection conductors (51, 52) by covering the inner wall surfaces of the second through holes 22.

A distance between an inner wall surface of a second through hole 22 and an inner wall surface of a third through hole 23, that is, a thickness (T) of an insulating film formed by a non-conductive resin 6 between these two through holes, is, for example, 50 μm or more and 125 μm or less. When the insulating film formed of the non-conductive resin 6 has a thickness in such a range, it is thought that a short circuit between each second interlayer connection conductor 52 and its surrounding interlayer connection conductors (51, 52) can be effectively prevented and its influence on the size of the wiring substrate 1 is small.

In the wiring substrate 1 of the example of FIGS. 1-3, the first interlayer connection conductors 51 and the second interlayer connection conductors 52 each have a tubular shape. That is, the first interlayer connection conductors 51 and the second interlayer connection conductors 52 each have a hollow part on an inner side of a tubular body formed a plating metal such as copper. In the example of FIGS. 1-3, the hollow part of each of the first interlayer connection conductors 51 and the second interlayer connection conductors 52 is filled with a filler 7. Since the hollow part of each of the first and second interlayer connection conductors (51, 52) is filled with the filler 7, as in other embodiments to be described later, when the wiring substrate 1 is used as a part of a multilayer wiring substrate, a via conductor can be directly formed on each of the interlayer connection conductors (51, 52).

A material of the filler 7 is not particularly limited as long as the filler 7 can fill the hollow part of each of the interlayer connection conductors (51, 52). The filler 7 may be non-conductive or conductive. The filler 7 is, for example, an insulating resin such as an epoxy resin, an acrylic resin, or a phenol resin. Further, the filler 7 may be a conductive paste or a conductive ink containing conductive particles such as silver particles, and an epoxy resin or the like. In the present embodiment, it is also possible that the interlayer connection conductors (51, 52) do not each have a hollow part. That is, the first interlayer connection conductors 51 and/or the second interlayer connection conductors 52 filling the entire first through holes 21 or third through holes 23 may be formed by a plating film of copper or the like.

When the filler 7 is an insulating resin, the non-conductive resins 6 and the filler 7 may contain the same resin material as a main component. For example, the non-conductive resins 6 and the filler 7 may be all epoxy resins. When the non-conductive resins 6 and the filler 7 contain the same resin material, a difference between a thermal expansion coefficient of the non-conductive resins 6 and a thermal expansion coefficient of the filler 7 is thought to be small. Since the difference in the thermal expansion coefficient between the members sandwiching the second interlayer connection conductors 52 is small, it is thought that a thermal stress applied to the second interlayer connection conductors 52 is relatively small. It is thought that a defect such as a crack in the second interlayer connection conductors 52 is unlikely to occur.

When the non-conductive resins 6 and the filler 7 mainly contain different materials, the non-conductive resins 6 may have a thermal expansion coefficient between a thermal expansion coefficient of the insulating layer 3 and the thermal expansion coefficient of the filler 7. In this case, it is thought that there is relatively less peeling between the non-conductive resins 6 and the insulating layer 3 1 and a thermal stress applied to the second interlayer connection conductors 52 is relatively small.

As illustrated in FIG. 2, two end parts of each of the first interlayer connection conductors 51 and the second interlayer connection conductors 52 in the thickness direction of the insulating layer 3 are each covered by a metal film 41 and a plating film 42. The metal film 41 and the plating film 42 are so-called lid plating films with respect to each of the interlayer connection conductors (51, 52). Since the metal film 41 and the plating film 42 are formed, as will be described later, when the wiring substrate 1 is used as a part of a multilayer wiring substrate, it may be possible to electrically connect the interlayer connection conductors (51, 52) to via conductors formed directly thereon. Similar to the metal film 501, the metal film 41 is formed by electroless plating, sputtering, or the like. Similar to the plating film 502, the plating film 42 is formed by, for example, electrolytic plating. The metal film 41 and the plating film 42 are each formed of, for example, a metal such as copper or nickel.

As illustrated in FIG. 2, in the wiring substrate 1, the two conductor layers 4 opposing each other via the insulating layer 3 each have a 5-layer structure (in FIG. 1, illustration of each of the conductor layers 4 is simplified). That is, the conductor layers 4 each include a metal foil 40, the metal film 501 on the metal foil 40, the plating film 502 on the metal film 501, the metal film 41 on the plating film 502, and the plating film 42 on the metal film 41. As described above, the metal film 501 and the plating film 502 each include a portion forming the first interlayer connection conductors 51 or the second interlayer connection conductors 52 and a portion forming the conductor layers 4, and the two portions are integrally formed. The metal foil 40 is formed of any metal. For example, the metal foil 40 is a copper foil or a nickel foil.

A laminated structure of each of the conductor layers 4 is not limited to the 5-layer structure illustrated in FIG. 2, and can have any total number of layers. For example, it is also possible that the metal film 41 and the plating film 42 are not formed. In this case, the conductor layers 4 may each have a 3-layer structure. Further, it is also possible that the metal foil 40 is not provided. In this case, the conductor layers 4 may each have a 2-layer structure or a 4-layer structure.

As illustrated in FIG. 3, the conductor layers 4 each include multiple conductor pads (through-hole pads) (4a) that are respectively connected to the first interlayer connection conductors 51 or the second interlayer connection conductors 52. Although not illustrated in the drawings, the conductor layers 4 can each include a desired conductor pattern in addition to the conductor pads (4a). In a central part of the example of FIG. 3, two conductor pads (4a) formed in a direction orthogonal to the I-I line are connected to each other. In this way, the second interlayer connection conductors 52 (and/or the second interlayer connection conductors 52 and the first interlayer connection conductors 51) may be electrically connected to each other via the through-hole pads thereof. In the example of FIG. 3, a middle portion (connection portion) of a conductor pad formed by connecting two conductor pads (4a) is constricted. For example, when the individual conductor pads (4a) also serve as mounting pads, it may be preferable for preventing a misalignment of a mounting component or the like.

Next, an example of a method for manufacturing the wiring substrate 1 of FIG. 1 is described with reference to FIGS. 4A-4G.

Figure 4A:
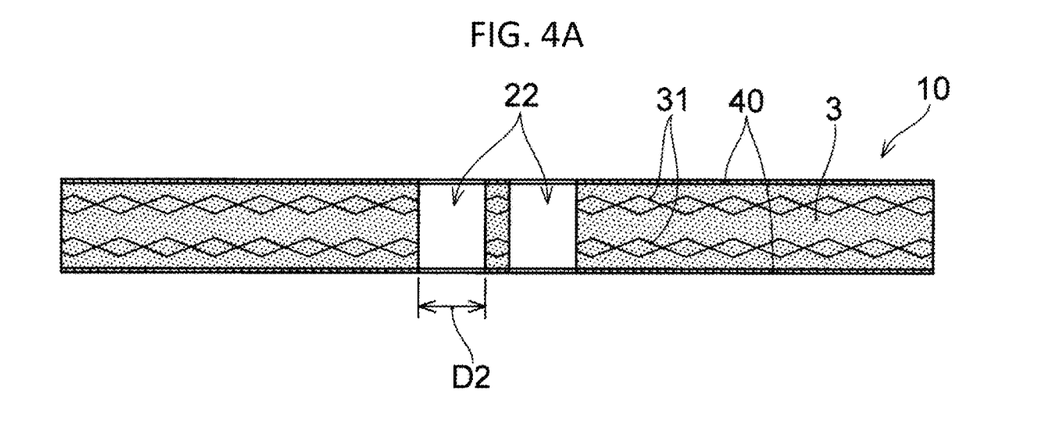
FIG. 4A is a cross-sectional view illustrating a state after formation of second through holes in a manufacturing process of a wiring substrate according to an embodiment of the present invention.

As illustrated in FIG. 4A, a starting substrate 10 is prepared that includes an insulating layer as the insulating layer 3 of the wiring substrate 1 and metal foils 40 which are respectively laminated on both sides of the insulating layer. The insulating layer of the starting substrate 10 is formed, for example, using an insulating resin such as epoxy resin, and contains a reinforcing material 31 formed of a glass fiber or the like.

Then, through holes (the second through holes 22) penetrating the starting substrate 10 are formed. The second through holes 22 are formed at predetermined positions where the second interlayer connection conductors are to be formed. The second through holes 22 are formed, for example, by laser processing in which carbon dioxide laser is irradiated, or by drilling or the like. A spot diameter of a laser beam, or a drill diameter, is selected such that the second through holes 22 formed each have a predetermined inner diameter (D2).

Figure 4B:
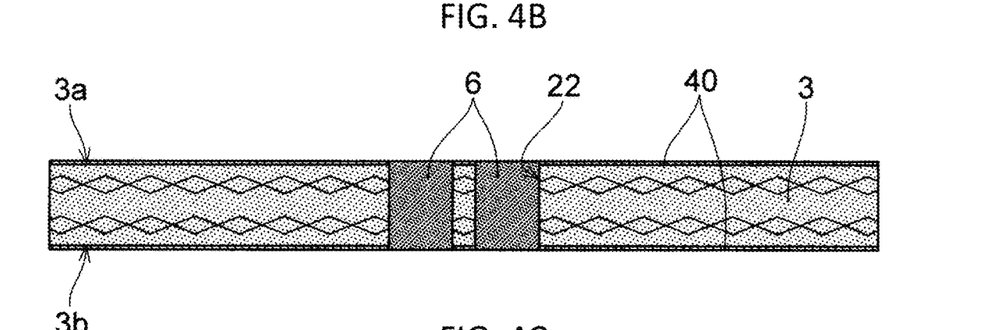
FIG. 4B is a cross-sectional view illustrating a state after filling of each of the second through holes with a non-conductive resin in the manufacturing process of a wiring substrate according to the embodiment.

As illustrated in FIG. 4B, the second through holes 22 are respectively filled with the non-conductive resins 6. The inner wall surfaces of the second through holes 22 are respectively covered by the non-conductive resins 6. For example, an epoxy resin, an acrylic resin, a phenolic resin, or the like is injected from either one or both of a first surface (3a) side of the insulating layer 3 and a second surface (3b) side on an opposite side with respect to the first surface (3a) side. When necessary, an epoxy resin or the like supplied from one of the first surface (3a) side and the second surface (3b) side may be sucked from the other side through the second through holes 22. The non-conductive resins 6 may contain inorganic particles such as magnetic particles. The non-conductive resins 6 that are respectively injected into the second through holes 22 are cured by heating or the like when necessary.

Of the non-conductive resins 6 that are respectively injected into the second through holes 22, end surfaces on the first surface (3a) side and the second surface (3b) side of the insulating layer 3 are polished when necessary using any method such as chemical mechanical polishing. It is preferable that the two end surfaces of each of the non-conductive resins 6 are respectively substantially flush with the surfaces of the metal foils 40 on the first surface (3a) and on the second surface (3b).

Figure 4C:
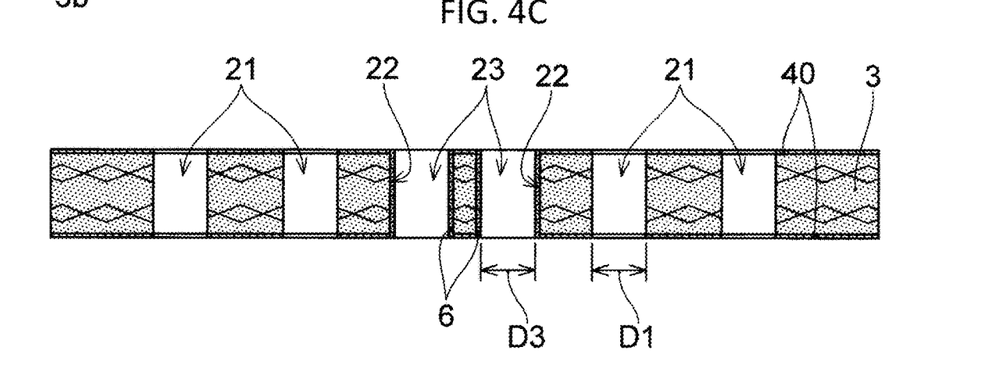
FIG. 4C is a cross-sectional view illustrating a state after formation of first and third through holes in the manufacturing process of a wiring substrate according to the embodiment.

As illustrated in FIG. 4C, the first through holes 21 and the third through holes 23 are formed. The first through holes 21 are respectively formed at predetermined positions where the first interlayer connection conductors are to be formed. The third through holes 23 are respectively at predetermined positions where the second interlayer connection conductors are to be formed, that is, at positions where the non-conductive resins 6 in the second through holes 22 are penetrated. Tubular shapes that are respectively formed by the non-conductive resins 6 are formed. In other word, film bodies that respectively cover the inner wall surfaces of the second through holes 22 are respectively formed along the inner wall surfaces of the second through holes 22.

Similar to the second through holes 22, the first and third through holes (21, 23) are formed, for example, by laser processing using carbon dioxide laser, or by drilling or the like. A spot diameter of a laser beam, or a drill diameter, is selected such that the first through holes 21 formed each have a predetermined inner diameter (D1) and the third through holes 23 formed each have a predetermined inner diameter (D3). The spot diameter or the drill diameter or the like may be selected such that the inner diameter (D1) of each of the first through holes 21 and the inner diameter (D3) of each of the third through holes 23 are substantially the same.

Figure 4D:
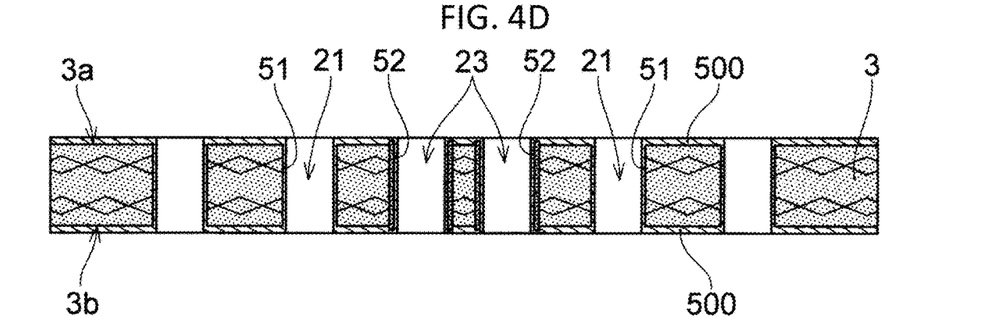
FIG. 4D is a cross-sectional view illustrating a state after formation of interlayer connection conductors in the manufacturing process of a wiring substrate according to the embodiment.

As illustrated in FIG. 4D, the first interlayer connection conductors 51 and the second interlayer connection conductors 52 are respectively formed in the first through holes 21 and in the third through holes 23. In FIG. 4D, the illustration of the interlayer connection conductors (51, 52) is simplified. However, the metal film 501 and the plating film 502 described above (see FIG. 2) are formed on the inner wall surface of each of the first and third through holes (21, 23). The metal film 501 is formed by, for example, sputtering or electroless plating. Further, the plating film 502 is formed by, for example, electrolytic plating. The first and second interlayer connection conductors (51, 52) each including the metal film 501 and the plating film 502 are formed of, for example, a metal such as copper or nickel. The first interlayer connection conductors 51 and the second interlayer connection conductors 52 each having a tubular shape along an inner wall surface of a first through hole 21 or along an inner wall surface of a third through hole 23 are formed. The metal film 501 and the plating film 502 are also formed on each of the first surface (3a) and the second surface (3b) of the insulating layer 3 (specifically, on each of the metal foils 40 of FIG. 4C), and a metal layer 500 having a 3-layer structure is formed on each of the first and second surfaces (3a, 3b).

Figure 4E:
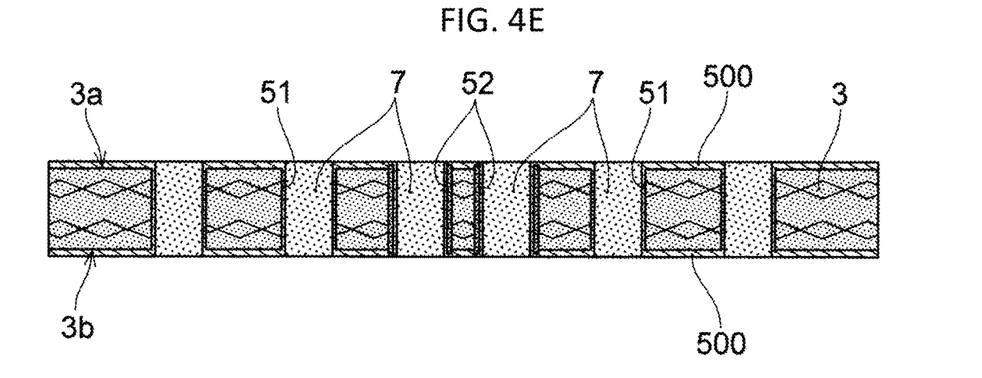
FIG. 4E is a cross-sectional view illustrating a state after filling of each of the interlayer connection conductors with filler in the manufacturing process of a wiring substrate according to the embodiment.

As illustrated in FIG. 4E, the interior (hollow part) of each of the first interlayer connection conductors 51 and the second interlayer connection conductors 52 is filled with the filler 7. For example, a resin such as an epoxy resin, an acrylic resin, or a phenolic resin is injected from either one or both of the first surface (3a) side and the second surface (3b) side of the insulating layer 3 into the interiors of the first interlayer connection conductors 51 and the second interlayer connection conductors 52. When necessary, an epoxy resin or the like supplied from one of the first surface (3a) side and the second surface (3b) side may be sucked from the other side. The filler 7 injected into the interiors of the first and second interlayer connection conductors (51, 52) is cured by heating or the like when necessary.

The filler 7 may contain as a main component a resin material that is substantially the same as a resin material that is contained as a main component in the non-conductive resins 6. Further, instead of an insulating resin such as an epoxy resin, for example, a conductive paste containing conductive particles such as silver particles may be used as the filler 7. The interiors of the first interlayer connection conductors 51 and the second interlayer connection conductors 52 may be filled with a conductive paste.

When necessary, end faces of the filler 7 on the first surface (3a) side and on the second surface (3b) side are polished using any method such as chemical mechanical polishing. It is preferable that the two end surfaces of the filler 7 are respectively substantially flush with the surface of the metal layer 500 on the first surface (3a) side and the surface of the metal layer 500 on the second surface (3b) side.

Figure 4F:
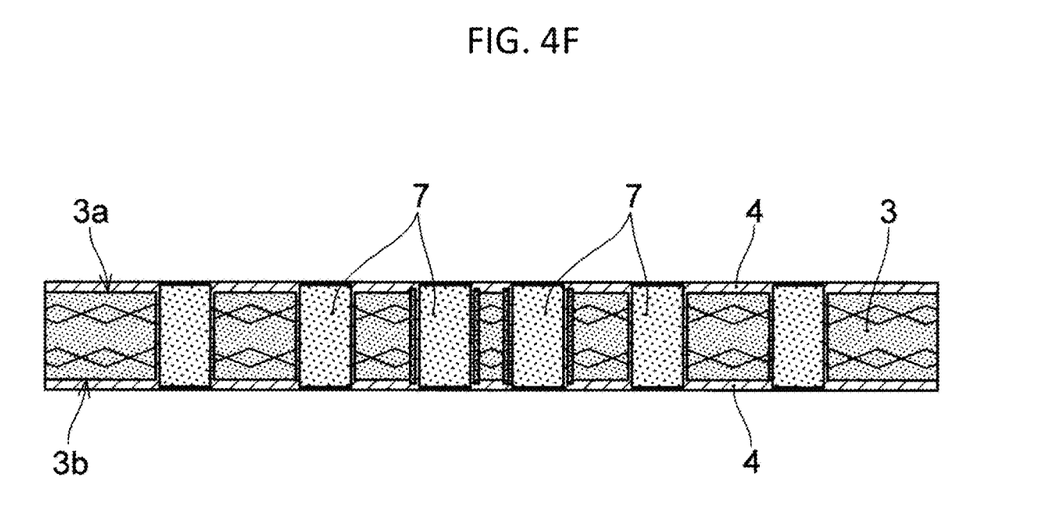
FIG. 4F is a cross-sectional view illustrating a state after formation of conductor layers in the manufacturing process of a wiring substrate according to the embodiment.

As illustrated in FIG. 4F, the conductor layers 4 are respectively formed on the first surface (3a) and on the second surface (3b) of the insulating layer 3. Specifically, the metal film 41 and the plating film 42 (see FIG. 2) described above are formed on the metal layers 500 and on the non-conductive resins 7. As a result, the conductor layers 4 each having a structure of 5 layers in total are formed. So-called lid plating films are formed on each of the first and second interlayer connection conductors (51, 52). The metal film 41 is formed by, for example, sputtering or electroless plating. Further, the plating film 42 is formed by, for example, electrolytic plating.

Figure 4G:
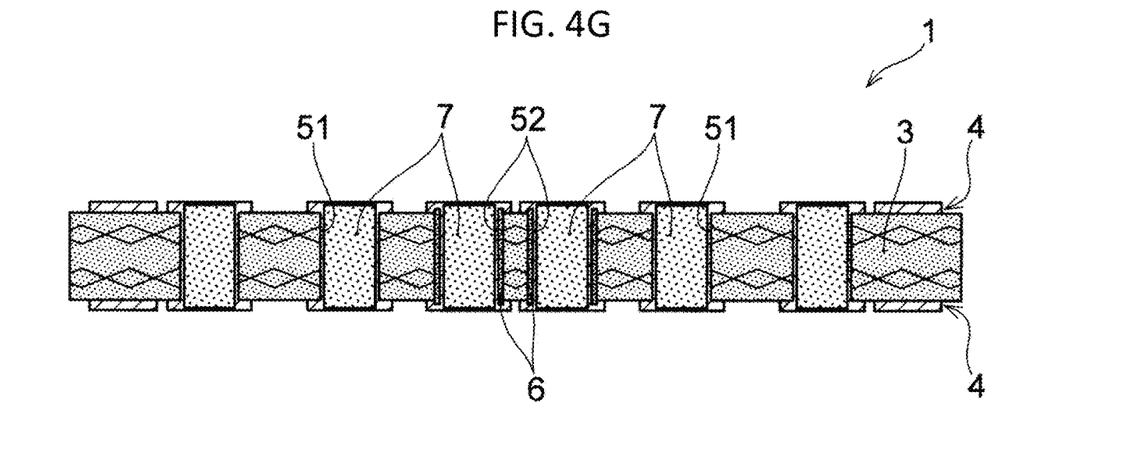
FIG. 4G is a cross-sectional view illustrating a state after patterning of the conductor layers in the manufacturing process of a wiring substrate according to the embodiment.

As illustrated in FIG. 4G, the conductor layers 4 are patterned to each have a desired conductor pattern. For example, etching masks each having appropriate openings are respectively provided on the conductor layers 4, and unwanted portions of the conductor layers 4 are removed by wet etching or dry etching. As a result, the wiring substrate 1 illustrated in FIG. 1 is completed.

Other embodiments of the present invention are described with reference to FIGS. 5A-5C.

Figure 5A:
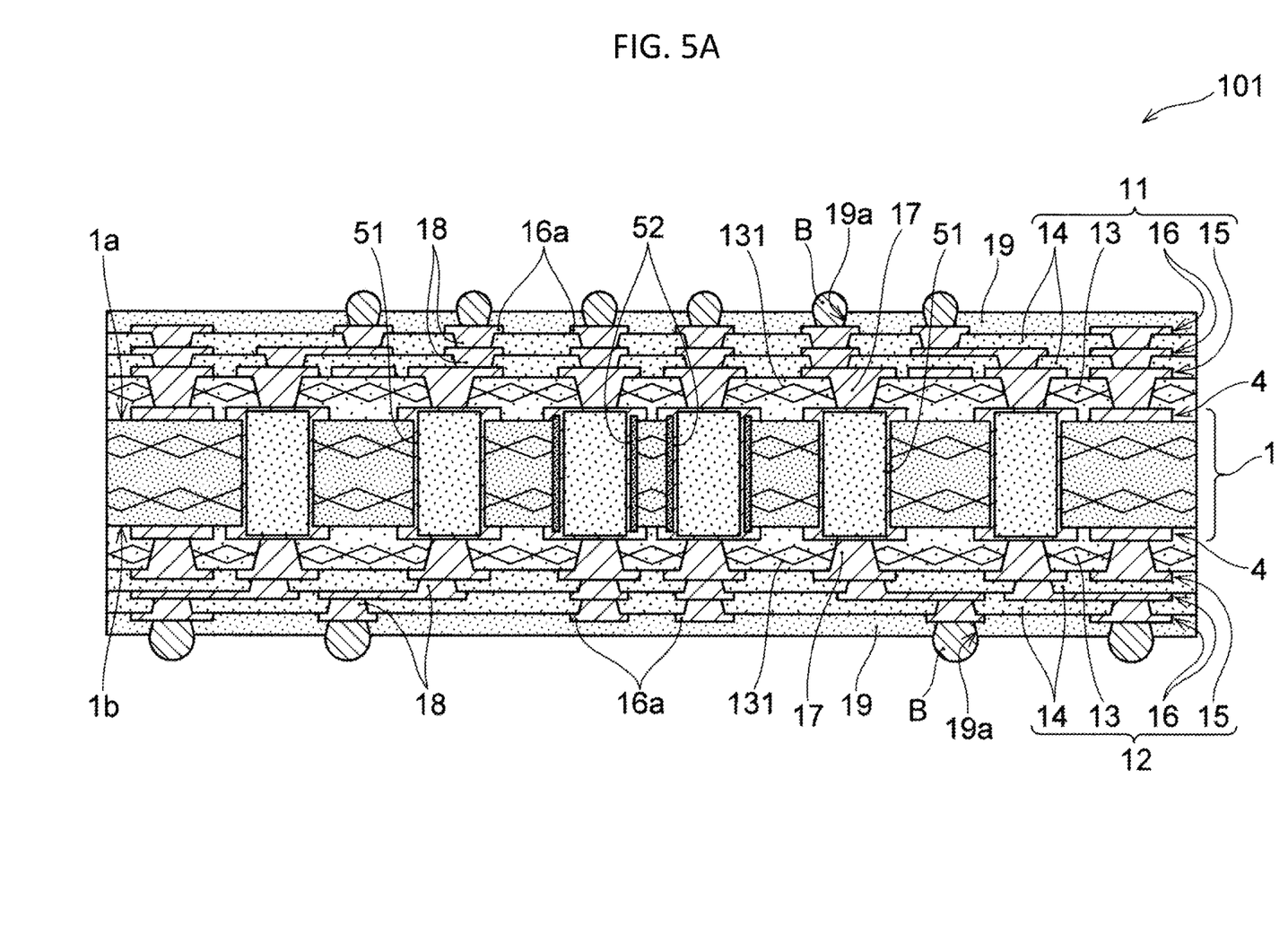
FIG. 5A is a cross-sectional view illustrating an example of a wiring substrate according to another embodiment of the present invention.

FIG. 5A illustrates a wiring substrate 101 which is an example of another embodiment. As illustrated in FIG. 5A, the wiring substrate 101 is a multilayer wiring substrate having the wiring substrate 1 of the embodiment as a core substrate. That is, build-up layers are respectively formed on a first surface (1a), which is one of two main surfaces perpendicular to a thickness direction of the wiring substrate 1, and on a second surface (1b) on an opposite side with respect to the first surface (1a). On the first surface (1a), a first build-up layer 11 is formed that includes: an insulating layer 13; a conductor layer 15 laminated on the insulating layer 13; and two insulating layers 14 and two conductor layers 16 that are alternately laminated on the insulating layer 13 and the conductor layer 15. On the second surface (1b), similar to the first build-up layer 11, a second build-up layer 12 is formed including insulating layers (13, 14) and conductor layers (15, 16).

In the description of the wiring substrates (the wiring substrate 101 and wiring substrates (102, 103) to be described below) of the present embodiment, a side farther from the core substrate (wiring substrate 1) in the thickness direction of the wiring substrate is also referred to as an "upper side" or simply "upper," and a side closer to the core substrate is also referred to as a "lower side" or simply "lower." Further, for the conductor layers and the insulating layers, a surface facing an opposite side with respect to the core substrate is also referred to as an "upper surface," and a surface facing the core substrate is also referred to as a "lower surface."

In the wiring substrate 101, further, solder resist layers 19 are respectively formed on the first build-up layer 11 and the second build-up layer 12. In the solder resist layers 19, openings (19a) are provided that each expose a portion of the outermost conductor layers 16 of the first and second build-up layers (11, 12). In each of the openings (19a), for example, a bump (B) is formed using a conductive material such as solder.

Further, in the insulating layer 13 of each of the first and second build-up layers (11, 12), via conductors 17 penetrating the insulating layer 13 are formed. The via conductors 17 connect to each other the conductor layer 4 and the conductor layer 15 that sandwich the insulating layer 13. Further, in each of the insulating layers 14 of each of the first and second build-up layers (11, 12), via conductors 18 penetrating the each of the insulating layers 14 are formed. The via conductors 18 connect to each other the conductor layers 16 that sandwich the insulating layer 14 or the conductor layer 15 and the conductor layer 16 that sandwich the insulating layer 14.

Similar to the insulating layer 3, the insulating layer 13 and the insulating layers 14 are each formed of any insulating resin. Examples of the insulating resin include an epoxy resin, a bismaleimide triazine resin (BT resin), a phenol resin, and the like. The insulating layers (13, 14) may each contain inorganic filler such as silica, and may each contain woven fabric or non-woven fabric reinforcing material formed of a glass fiber, an aramid fiber, or the like. In the example of FIG. 5A, the insulating layer 13 contains a reinforcing material 131.

Similar to the conductor layers 4, the conductor layers (15, 16) are each formed of any metal such as copper or nickel. The conductor layers (15, 16) can each have a multilayer structure that includes a metal foil, an electroless plating film or a sputtering film, and/or an electrolytic plating film, and the like. Further, the conductor layers (15, 16) can each include any conductor pattern. The outermost conductor layer 16 of each of the first and second build-up layers (11, 12) includes connection pads (16a) to which an external electronic component or a wiring substrate or the like is connected. The openings (19a) are provided in the solder resist layers 19 so as to expose the connection pads (16a), and the bumps (B) are respectively formed on the connection pads (16a).

Each of the via conductors (17, 18) is integrally formed with a conductor layer 15 or a conductor layer 16 on an upper side thereof, and is formed, for example, by an electroless plating film and an electrolytic plating film. In the example of FIG. 5A, the via conductors (17, 18) are so-called filled via conductors that respectively fill through holes provided in the insulating layers. However, the via conductors (17, 18) may also be so-called conformal via conductors. In the example of FIG. 5A, some of the via conductors (17, 18) are laminated on the through-hole conductors (the first or second interlayer connection conductors (51, 52)) of the core substrate (the wiring substrate 1).

The first and second build-up layers (11, 12) can each be formed, for example, by repeating formation of an insulating layer by laminating a film-like epoxy resin or the like, and formation of a conductor layer and via conductors using any method such as an additive method or a subtractive method.

As in the example of FIG. 5A, the wiring substrate 1 including the first interlayer connection conductors 51 and the second interlayer connection conductors 52 may be a core substrate of a multilayer wiring substrate (the wiring substrate 101). On each of both sides (the first surface (1a) and the second surface (1b)) of the wiring substrate 1 used as a core substrate, less than 3 pairs or more than 3 pairs of insulating layers and conductor layers may be laminated.

Figure 5B:
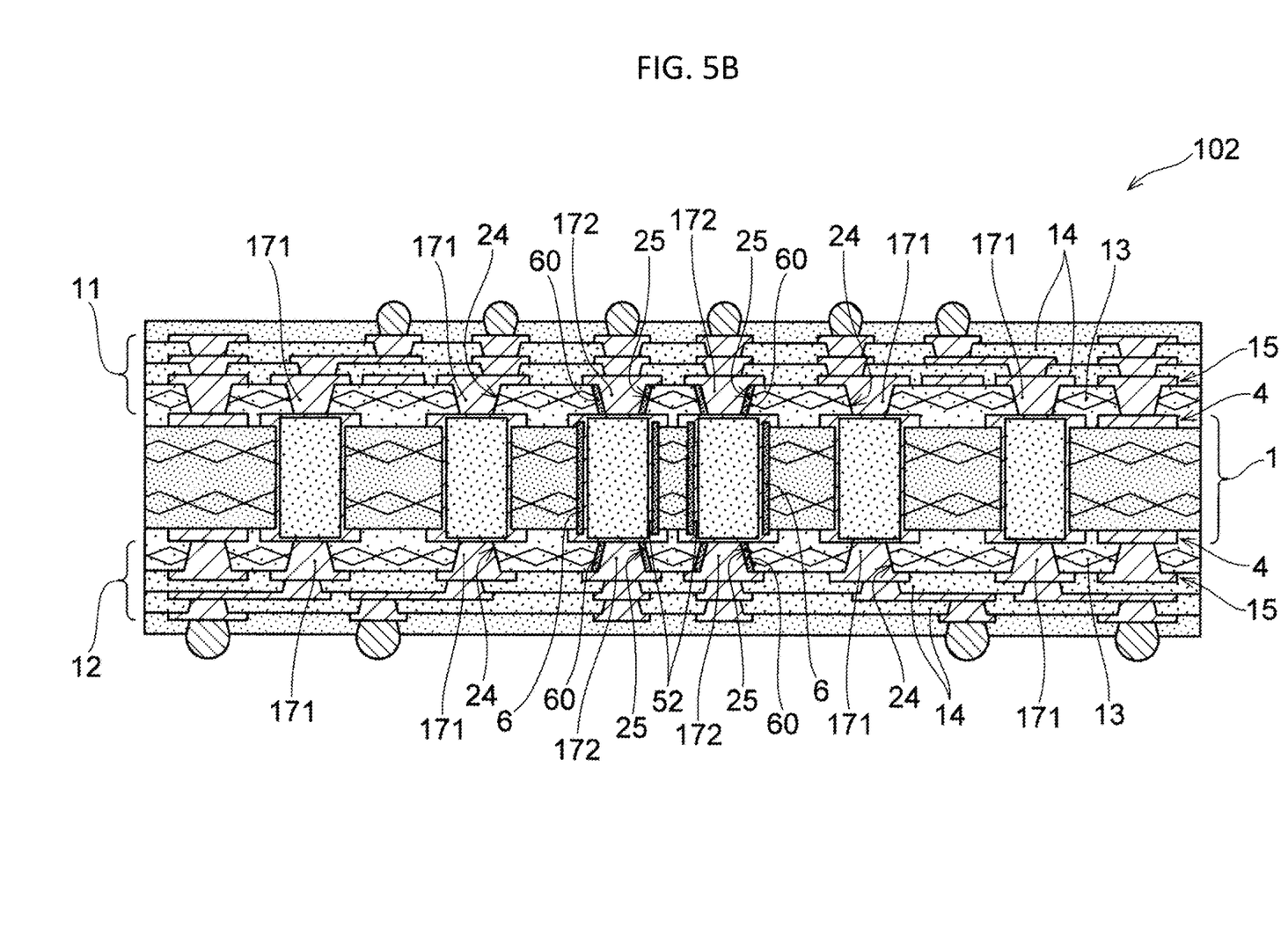
FIG. 5B is a cross-sectional view illustrating another example of a wiring substrate according to the other embodiment of the present invention.

FIG. 5B illustrates a wiring substrate 102 which is another example of the present embodiment. As illustrated in FIG. 5B, similar to the wiring substrate 101 of FIG. 5A, the wiring substrate 102 is a multilayer wiring substrate that includes the first and second build-up layers (11, 12). The wiring substrate 102 differs from the wiring substrate 101 of FIG. 5A in that the insulating layer 13 of each of the build-up layers (11, 12) includes first via conductors 171 and second via conductors 172. Since the structure of the wiring substrate 102 is the same as that of the wiring substrate 101 of FIG. 5A except for the via conductors 172 in the insulating layers 13, description about the same structural elements is omitted.

In the wiring substrate 102, the insulating layer 13 of each of the build-up layers (11, 12) includes multiple via conductors including the first via conductors 171 and the second via conductors 172. The multiple via conductors are interlayer connection conductors connecting to each other two conductor layers (the conductor layer 4 and the conductor layer 15) that oppose each other via the insulating layer 13. The second via conductors 172 are respectively formed of plating films in fifth through holes 25 which are some of multiple through holes of the insulating layer 13. The first via conductors 171 are respectively formed of plating films in fourth through holes 24 which are through holes other than the fifth through holes 25 in the insulating layer 13. In the wiring substrate 102, the insulating layers 13 each include multiple first via conductors 171 and multiple second via conductors 172.

The wiring substrate 102 further includes non-conductive resins 60 that respectively cover inner walls of the fifth through holes 25. Similar to the non-conductive resins 6 of FIG. 1, the non-conductive resins 60 are, for example, epoxy resins, acrylic resins, phenol resins, or the like. However, the non-conductive resins 60 are not limited to these resins.

The second via conductors 172 are respectively formed on inner peripheral sides of the non-conductive resins 60 in the fifth through holes 25. Therefore, the non-conductive resins 60 are respectively interposed between the second via conductors 172 and the inner walls of the fifth through holes 25. Therefore, contact between the second via conductors 172 and surrounding conductors via the insulating layer 13 is prevented by the non-conductive resins 60. For example, it is thought that a short circuit between each second via conductor 172 and its surrounding via conductors (171, 172) is prevented.

Therefore, in the wiring substrate 102, a minimum distance between the second via conductors 172 is smaller than a minimum distance between the first via conductors 171. Therefore, by appropriately using the second via conductors 172, the multiple via conductors in the insulating layer 13 can be formed close to each other and/or densely.

Further, in the wiring substrate 102, the minimum distance between the second via conductors 172 may be the same as the minimum distance between the first via conductors 171 and the second via conductors 172, or may be less than the minimum distance between the first via conductors 171 and the second via conductors 172. Further, the minimum distance between the first via conductors 171 and the second via conductors 172 may be smaller than the minimum distance between the first via conductors 171.

The second via conductors 172 that are respectively formed on the inner peripheral sides of the non-conductive resins 60 in the fifth through holes 25 can be formed, for example, in the same manner as the formation of the second interlayer connection conductors 52 of the wiring substrate 1 of the embodiment. That is, the second via conductors 172 can be formed by forming the fifth through holes 25 by irradiation of laser or the like, filling the fifth through holes 25 with the non-conductive resins 60, forming the through holes in the non-conductive resins 60, and forming the electroless plating film and the electrolytic plating film in the through holes. The second via conductors 172 together with the first via conductors 171 can be formed at the same time as the formation of the conductor layer 15. The first via conductors 171 and the second via conductors 172 are so-called filled via conductors.

As in FIG. 5B, the second interlayer connection conductors (second via conductors 172), which can be prevented by the non-conductive resins 60 from causing a short circuit with surrounding interlayer connection conductors (first and second via conductors (171, 172)) may be included in the insulating layers in the build-up layers of the multilayer wiring substrate. In the wiring substrate 102 of FIG. 5B, it is also possible that the interlayer connection conductors that are prevented by the non-conductive resins from causing a short circuit are not formed in the wiring substrate 1 as the core substrate. Further, it is also possible that interlayer connection conductors (via conductors) that are prevented by non-conductive resins from causing a short circuit are formed in the insulating layers 14.

Figure 5C:
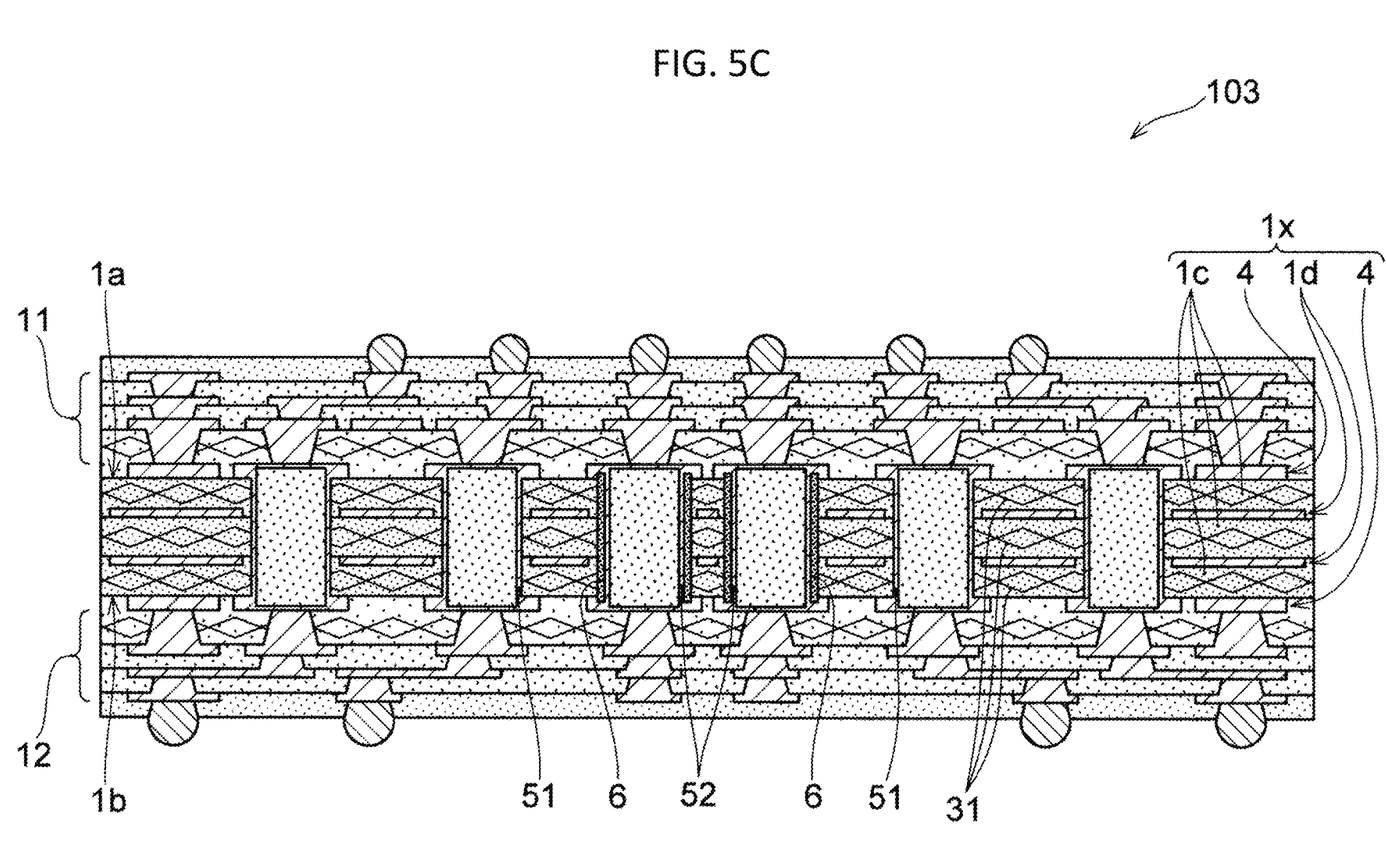
FIG. 5C is a cross-sectional view illustrating yet another example of a wiring substrate according to the other embodiment of the present invention.

FIG. 5C illustrates a wiring substrate 103 which is yet another example of the present embodiment. As illustrated in FIG. 5C, similar to the wiring substrate 101 of FIG. 5A, the wiring substrate 103 is a multilayer wiring substrate that includes the first and second build-up layers (11, 12). The wiring substrate 103 differs from the wiring substrate 101 of FIG. 5A in that a core substrate (1x) having a multilayer structure is provided. Since the structure of the wiring substrate 103 is the same as that of the wiring substrate 101 of FIG. 5A except for the structure of the core substrate (1x), description about the same structural elements is omitted.

As illustrated in FIG. 5C, in addition to the two conductor layers 4, the core substrate (lx) includes two conductor layers (1d), and three insulating layers (1c) that are respectively interposed between the conductor layers. Similar to the insulating layer 3 of the wiring substrate 101 of FIG. 5A, the three insulating layers (1c) are each formed of any insulating resin such as an epoxy resin, and may each contain inorganic filler such as silica. The three insulating layers (1c) each contain a woven fabric or nonwoven fabric reinforcing material 31 formed of a glass fiber or the like. Similar to the conductor layers 4, the conductor layers (1d) each include a metal foil and a plating film which are each formed of any metal such as copper, and can each include any conductor pattern. The core substrate (1x) is a laminated substrate which is formed, for example, by collectively laminating prepregs (which respectively form the upper and lower insulating layers (1c)) and metal foils (which respectively form the conductor layers 4) on both sides of the middle insulating layer (1c) with the conductor layers (1d) on both sides thereof.

In the wiring substrate 103 of FIG. 5C, the first and second interlayer connection conductors (51, 52) collectively penetrate three insulating layers (1c), and connect the two opposing conductor layers 4 to each other via the three insulating layers (1c). Also in the wiring substrate 103, the side peripheral surfaces of the second interlayer connection conductors 52 are respectively surrounded by the non-conductive resins 6, and a short circuit between each second interlayer connection conductor 52 and its surrounding interlayer connection conductors is prevented by the non-conductive resins 6. Thus, the first interlayer connection conductors 51 and the second interlayer connection conductors 52 may penetrate multiple insulating layers and may be provided in a laminated substrate such as the core substrate (1x).

The core substrate (1x) of the wiring substrate 103 of FIG. 5C may include more than four conductor layers and a total of three or more insulating layers interposed between these conductor layers. Further, the core substrate (1x) can be used alone in any electronic device without the build-up layers (11, 12) on the first and second surfaces (1a, 1b) of the core substrate (1x).

The wiring substrate of the embodiment is not limited to those having the structures illustrated in the drawings and those having the structures, shapes, and materials exemplified in the present specification. For example, it is also possible that multiple second interlayer connection conductors 52 are not provided.

In the multilayer wiring substrate described in Japanese Patent Application Publication No. 2003-142826, two through-hole conductors that are closest to each other or two through-hole conductors that are close to each other at a distance below a predetermined value are not formed along an extension direction of the glass fiber in order to prevent a short circuit due to migration. Design flexibility regarding the positions of the through-hole conductors in pattern design of the multilayer wiring substrate is thought to be low. It is thought that a desired electrical characteristic of the multilayer wiring substrate may not be obtained or a desired size of the multilayer wiring substrate may not be obtained.

A wiring substrate according to an embodiment of the present invention includes: an insulating layer having multiple through holes; two conductor layers opposing each other via the insulating layer; multiple interlayer connection conductors connecting the two conductor layers to each other; and non-conductive resins that respectively cover inner walls of a group of through holes in the multiple through holes. The multiple interlayer connection conductors include at least two first interlayer connection conductors that are respectively formed of plating films in through holes other than the group of through holes among the multiple through holes, and at least two second interlayer connection conductors that are respectively formed by plating films in the group of through holes. A minimum distance between the second interlayer connection conductors is smaller than a minimum distance between the first interlayer connection conductors.

According to an embodiment of the present invention, a wiring substrate that has high insulation reliability between conductors connecting conductor layers and has desired electrical characteristics and size can be provided.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   an insulating layer having a plurality of through holes;
   a first conductor layer formed on a first surface of the insulating layer;
   a second conductor layer formed on a second surface of the insulting layer on an opposite side with respect to the first surface of the insulating layer; and
   a plurality of interlayer connection conductors formed in the through holes through the insulating layer and connecting the first conductor layer and the second conductor layer,
   wherein the insulating layer is formed such that the plurality of though holes includes a first group of through holes and a second group of through holes and that the through holes in the second group have inner walls covered with non-conductive resin, respectively, and the plurality of interlayer connection conductors includes a plurality of first interlayer connection conductors each comprising a plating film formed in the first group of through holes, and a plurality of second interlayer connection conductors each comprising a plating film formed in the second group of through holes such that a minimum distance between the second interlayer connection conductors is smaller than a minimum distance between the first interlayer connection conductors.

2. The wiring substrate according to claim 1, wherein the plurality of interlayer connection conductors is formed such that the minimum distance between the second interlayer connection conductors is in a range of 150 µm to 300 µm.

3. The wiring substrate according to claim 2, wherein the plurality of interlayer connection conductors is formed such that the minimum distance between the second interlayer connection conductors is equal to or smaller than a minimum distance between the first interlayer connection conductors and the second interlayer connection conductors.

4. The wiring substrate according to claim 3, wherein the plurality of interlayer connection conductors is formed such that the minimum distance between the first interlayer connection conductors and the second interlayer connection conductors is in a range of 250 μm to 400 μm.

5. The wiring substrate according to claim 2, wherein the insulating layer includes a reinforcing material comprising a fiber material.

6. The wiring substrate according to claim 2, wherein the insulating layer is formed such that an inner diameter of each of the through holes in the second group is larger than an inner diameter of each of the through holes in the first group.

7. The wiring substrate according to claim 2, wherein the insulating layer is formed such that the non-conductive resin forms a plurality of second through holes formed in the through holes of the second group and covered by the second interlayer connection conductors such that an inner diameter of each of the second through holes is substantially equal to the inner diameter of each of the through holes in the first group.

8. The wiring substrate according to claim 2, wherein the plurality of interlayer connection conductors is formed such that each of the first interlayer connection conductors and the second interlayer connection conductors has a tubular shape such that a hollow portion of each of the first interlayer connection conductors and the second interlayer connection conductors is filled with non-conductive filler.

9. The wiring substrate according to claim 8, wherein the non-conductive resin and the non-conductive filler include a main component comprising a same resin material.

10. The wiring substrate according to claim 1, wherein the plurality of interlayer connection conductors is formed such that the minimum distance between the second interlayer connection conductors is equal to or smaller than a minimum distance between the first interlayer connection conductors and the second interlayer connection conductors.

11. The wiring substrate according to claim 10, wherein the plurality of interlayer connection conductors is formed such that the minimum distance between the first interlayer connection conductors and the second interlayer connection conductors is in a range of 250 μm to 400 μm.

12. The wiring substrate according to claim 10, wherein the insulating layer includes a reinforcing material comprising a fiber material.

13. The wiring substrate according to claim 10, wherein the insulating layer is formed such that an inner diameter of each of the through holes in the second group is larger than an inner diameter of each of the through holes in the first group.

14. The wiring substrate according to claim 10, wherein the insulating layer is formed such that the non-conductive resin forms a plurality of second through holes formed in the through holes of the second group and covered by the second interlayer connection conductors such that an inner diameter of each of the second through holes is substantially equal to the inner diameter of each of the through holes in the first group.

15. The wiring substrate according to claim 1, wherein the insulating layer includes a reinforcing material comprising a fiber material.

16. The wiring substrate according to claim 15, wherein the insulating layer is formed such that the through holes in the second group cut through the fiber material.

17. The wiring substrate according to claim 1, wherein the insulating layer is formed such that an inner diameter of each of the through holes in the second group is larger than an inner diameter of each of the through holes in the first group.

18. The wiring substrate according to claim 1, wherein the insulating layer is formed such that the non-conductive resin forms a plurality of second through holes formed in the through holes of the second group and covered by the second interlayer connection conductors such that an inner diameter of each of the second through holes is substantially equal to the inner diameter of each of the through holes in the first group.

19. The wiring substrate according to claim 1, wherein the plurality of interlayer connection conductors is formed such that each of the first interlayer connection conductors and the second interlayer connection conductors has a tubular shape such that a hollow portion of each of the first interlayer connection conductors and the second interlayer connection conductors is filled with non-conductive filler.

20. The wiring substrate according to claim 19, wherein the non-conductive resin and the non-conductive filler include a main component comprising a same resin material.

* * * * *